United States Patent
Aihara et al.

(10) Patent No.: US 11,705,693 B2
(45) Date of Patent: Jul. 18, 2023

(54) SEMICONDUCTOR OPTICAL ELEMENT

(71) Applicant: Nippon Telegraph and Telephone Corporation, Tokyo (JP)

(72) Inventors: Takuma Aihara, Tokyo (JP); Shinji Matsuo, Tokyo (JP); Takaaki Kakitsuka, Tokyo (JP); Tai Tsuchizawa, Tokyo (JP); Tatsuro Hiraki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 133 days.

(21) Appl. No.: 17/421,237

(22) PCT Filed: Dec. 24, 2019

(86) PCT No.: PCT/JP2019/050566
§ 371 (c)(1),
(2) Date: Jul. 7, 2021

(87) PCT Pub. No.: WO2020/145128
PCT Pub. Date: Jul. 16, 2020

(65) Prior Publication Data
US 2022/0045481 A1    Feb. 10, 2022

(30) Foreign Application Priority Data

Jan. 8, 2019   (JP) .................. 2019-000979

(51) Int. Cl.
*H01S 5/00*       (2006.01)
*H01S 5/20*       (2006.01)
(Continued)

(52) U.S. Cl.
CPC .......... *H01S 5/2031* (2013.01); *H01S 5/0424* (2013.01); *H01S 5/0651* (2013.01);
(Continued)

(58) Field of Classification Search
CPC .... H01S 5/2031; H01S 5/0424; H01S 5/0651; H01S 5/1032; H01S 5/12; H01S 5/2018; H01S 5/2022; H01S 5/2027
See application file for complete search history.

(56) References Cited

U.S. PATENT DOCUMENTS 6,071,832 A *  6/2000  Ishikawa ............. H01L 21/3003
                                                        257/E21.279
6,546,032 B1 *  4/2003  Oeda .................... B82Y 20/00
                                                        372/45.01
(Continued)

FOREIGN PATENT DOCUMENTS

JP   2001144372 A    5/2001
JP   2013152272 A    8/2013
(Continued)

*Primary Examiner* — Kinam Park
(74) *Attorney, Agent, or Firm* — Slater Matsil, LLP

(57) ABSTRACT

An embodiment semiconductor optical device includes an optical waveguide including a core, and an active layer extending in the waveguide direction of the optical waveguide for a predetermined distance and arranged in a state in which the active layer can be optically coupled to the core. The core and the active layer are arranged in contact with each other. The core is formed of a material with a refractive index of about 1.5 to 2.2, such as SiN, for example. In addition, the core is formed to a thickness at which a higher-order mode appears. The higher-order mode is an $E_{12}$ mode, for example.

20 Claims, 8 Drawing Sheets

(51) Int. Cl.

| | |
|---|---|
| *H01S 5/12* | (2021.01) |
| *H01S 5/10* | (2021.01) |
| *H01S 5/042* | (2006.01) |
| *H01S 5/065* | (2006.01) |
| *G02B 6/028* | (2006.01) |
| *H01S 5/223* | (2006.01) |

(52) U.S. Cl.
CPC .............. *H01S 5/1032* (2013.01); *H01S 5/12* (2013.01); *H01S 5/2018* (2013.01); *H01S 5/2022* (2013.01); *H01S 5/2027* (2013.01); *G02B 6/0281* (2013.01); *H01S 5/223* (2013.01); *H01S 2301/16* (2013.01)

(56) References Cited

U.S. PATENT DOCUMENTS

| | | | |
|---|---|---|---|
| 2010/0231092 A1* | 9/2010 | Andie | H03H 9/177 310/333 |
| 2010/0246612 A1* | 9/2010 | Shimizu | H01S 5/0602 372/18 |
| 2013/0259077 A1 | 10/2013 | Ben Bakir et al. | |
| 2013/0322816 A1* | 12/2013 | Takahashi | G02B 6/262 385/27 |

FOREIGN PATENT DOCUMENTS

| | | |
|---|---|---|
| JP | 2016051015 A | 4/2016 |
| JP | 2016171173 A | 9/2016 |

* cited by examiner

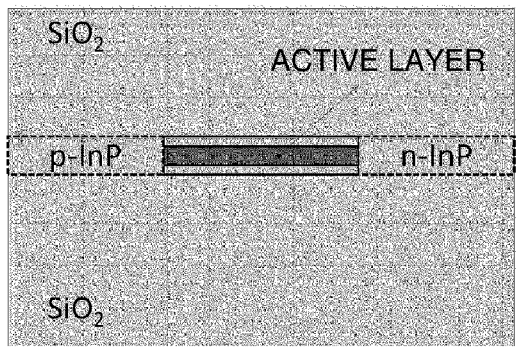
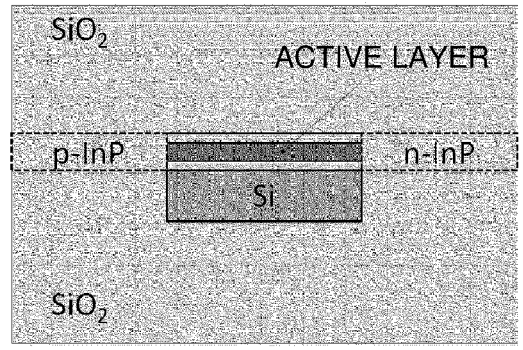
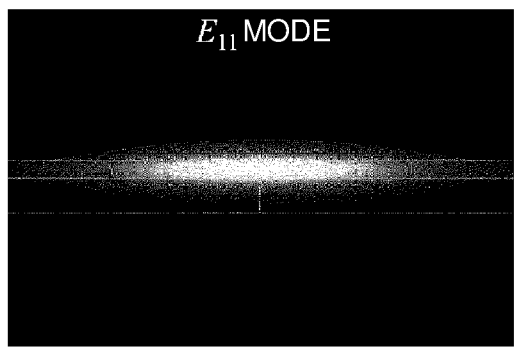
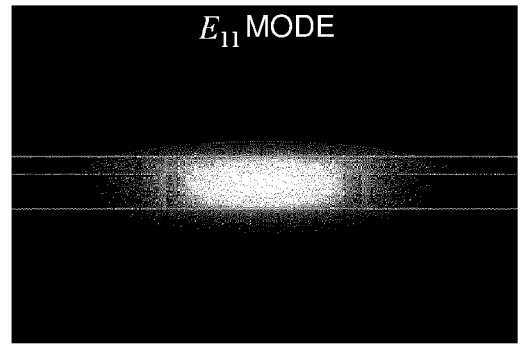
Fig. 14A
Fig. 14B
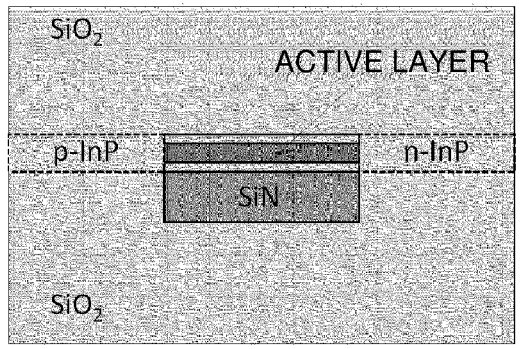
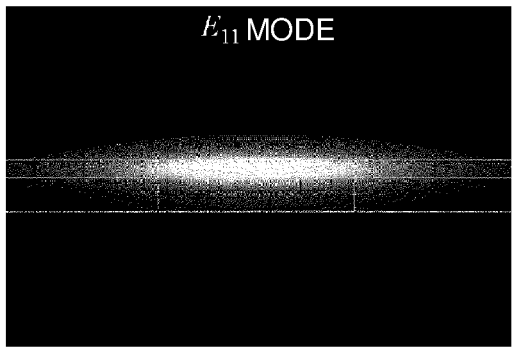
Fig. 14C

SEMICONDUCTOR OPTICAL ELEMENT

This patent application is a national phase filing under section 371 of PCT/JP2019/050566, filed Dec. 24, 2019, which claims the priority of Japanese patent application no. 2019-000979, filed Jan. 8, 2019, each of which is incorporated herein by reference in its entirety.

TECHNICAL FIELD

The present invention relates to a semiconductor optical device, and more particularly, relates to a semiconductor optical device applicable to a semiconductor laser used as a light source for an optical transmitter and the like.

BACKGROUND

With an increase in the communications traffic of a communication network, such as the Internet, an increase in the speed and capacity of optical fiber transmission has been demanded. In response to such demand, the development of a digital coherent communication technology that utilizes a coherent optical communication technology and a digital signal processing technology has been advanced, and a 100G system has been put into practical use. Such a communication system requires a high-output-power and narrow-linewidth semiconductor laser as a light-emission source for each of a transmitting station and a receiving station. In particular, for optical communication that uses phase signals, the linewidth of a laser that is related to signal quality is important, and it is considered that the narrower the linewidth of a laser, the better the signal quality.

The linewidth Δν of a semiconductor laser is given by the following Expression (1).

$$\Delta\nu = h\nu/(4\pi P_o) \times v_g^2 (\alpha_m + \alpha_o) F \alpha_m L(L_a/L_p) n_{sp}(1+\alpha^2) \quad (1)$$

It is based on the Schawlow-Townes relational expression (see Patent Literature 1). In Expression (1), h is the Planck constant, ν is the oscillation frequency, $P_o$ is the laser output, $v_g$ is the group velocity, $\alpha_m$ is the resonator loss, $\alpha_o$ is the waveguide loss, F is the output coefficient, K is the "Petermann's" factor, $L_a$ is the length of the active layer, $L_p$ is the length of the resonator, $n_{sp}$ is the light-emission recombination constant, and α is the linewidth-enhancement factor. From Expression (1), it is found to be effective to suppress the resonator loss of a semiconductor laser to reduce the linewidth of the laser.

However, reducing the resonator loss of a semiconductor laser means that light stays in the resonator for a long time and thus is susceptible to the influence of the loss of an optical waveguide. That is, when the resonator loss is reduced, it would be difficult to obtain sufficient optical output power if the loss of the optical waveguide is large. Thus, it is important to suppress the waveguide loss at the same time as suppressing the resonator loss to reduce the linewidth of the semiconductor laser.

The conventional semiconductor laser has a structure in which clad layers doped with impurities are formed above and below an active layer, and current is injected into the active layer in the longitudinal direction (i.e., a direction perpendicular to the substrate surface). Such a semiconductor laser will be described with reference to FIG. 12. The semiconductor laser includes a clad layer 602 of n-type InP, which is stacked on a substrate 601 of n-type InP, and an active layer 603 formed on the clad layer 602. The opposite sides of the clad layer 602 and the active layer 603 are embedded in embodiment layers 604 of p-type InP.

Current block layers 605 that are n-type InP layers are formed on the respective embodiment layers 604. An overclad layer 606 of p-type InP and a contact layer 607 of p-type InGaAs are formed in this order on the active layer 603 and the current block layers 605. The clad layer 602, the active layer 603, and the overclad layer 606 form an optical waveguide. In addition, two insulating layers 608 of SiO₂ are formed on the contact layer 607 in regions above the respective current block layers 605. A p-type electrode 611 in ohmic connection with the contact layer 607 is formed between the two insulating layers 608, and an n-type electrode 612 is in ohmic connection with the rear face of the substrate 601.

As such a semiconductor laser, an embedded structure in which current is efficiently injected into the active layer 603 is typical. However, the embedded laser has a problem in that the waveguide loss is large. This is because p-type semiconductor layers with large hole absorption amounts are present near the active layer, and an electric field spreads widely in the regions of such p-type semiconductors around the active layer, which becomes the main cause of propagation loss.

Thus, reducing the propagation loss due to the regions of the p-type semiconductors around the active layer is an important challenge. Patent Literature 1 proposes a semiconductor optical device that solves such a problem. Such a semiconductor optical device will be described with reference to FIGS. 13A and 13B.

The semiconductor optical device includes an optical waveguide 321 formed on a substrate 300 and including a clad layer 301 and a core 302. The core 302 is embedded in the clad layer 301. The semiconductor optical device also includes an active layer 303 extending in the waveguide direction of the optical waveguide 321 for a predetermined distance and arranged in a state in which the active layer 303 can be optically coupled to the core 302, and a semiconductor layer 304 formed on the active layer 303. Further, the semiconductor optical device also includes an n-type semiconductor layer 305 and a p-type semiconductor layer 306 that are formed in contact with the active layer 303 and the semiconductor layer 304 while sandwiching the active layer 303 and the semiconductor layer 304 therebetween. The core 302 is arranged between the substrate 300 and the active layer 303.

The semiconductor optical device also includes an n-type electrode 309 connected to the n-type semiconductor layer 305 via a contact layer 307, and a p-type electrode 310 connected to the p-type semiconductor layer 306 via a contact layer 308. The p-type semiconductor layer 306 and the n-type semiconductor layer 305 are formed sandwiching the active layer 303 therebetween in a direction parallel with the plane of the substrate 300.

In addition, in a resonator region 331 having a predetermined length in the direction in which the optical waveguide 321 extends, a diffraction grating 332 is formed on the upper face of the semiconductor layer 304, thus forming a distributed Bragg reflection structure (i.e., a resonator structure). It should be noted that the semiconductor optical device has non-reflective films (not illustrated) formed at opposite ends of the resonator region 331, and thus forms a distributed feedback laser.

Each of the substrate 300 and the clad layer 301 is formed of InP that has been made to have a semi-insulating property by being doped with iron, for example, and the core 302 is formed of InGaAsP. The active layer 303 is a quantum well structure obtained by stacking well layers of InGaAsP and barrier layers.

In addition, for example, the semiconductor layer 304 is formed of undoped InP, the n-type semiconductor layer 305 is formed of n-type InP doped with about $1\times10^{18}$ cm$^{-3}$ of Si, and the p-type semiconductor layer 306 is formed of p-type InP doped with Zn. Meanwhile, the contact layer 307 is formed of n-type InGaAs doped with Si, and the contact layer 308 is formed of InGaAs doped with Zn.

In such a semiconductor optical device, the core 302 is formed separately from the active layer 303 and light confinement in the active layer 303 is secured so that light is confined in the core 302 and the spread of an electric field in the p-type semiconductor layer 306 is suppressed.

The effect of using the core separately from the embedded active layer will be described with reference to FIGS. 14A-14C. FIG. 14A illustrates a schematic view of a cross-section of an embedded active layer thin film structure of a transverse current injection type, and the results of calculation of its electric field distribution. The material of the active layer is InGaAsP, and the material of the clad is InP. This structure is an embedded hetero structure in which InGaAsP is embedded in InP. Current is injected into InGaAsP from doped InP from the transverse direction.

The electric field distribution is the electric field distribution of the fundamental mode of the TE mode ($E_{pq}=E_{11}$ mode). The subscripts p and q represent the number of waves of the transverse electric field components in the x-axis direction, and the number of waves of the transverse electromagnetic field components in the y-axis direction, respectively. In FIG. 14A, an electric field is distributed around the active layer core as the center. At this time, the light confinement coefficient of p-type InP is $\Gamma_{pInp}=2.67\%$.

Meanwhile, FIG. 14B illustrates a structure in which a core of silicon (Si) is formed below the embedded active layer thin film structure. The refractive index of Si is 3.47, the thickness of the core is 0.5 μm, and the width of the core is 1 μm. Under such conditions, the light confinement coefficient of p-type InP is $\Gamma_{pInp}=0.16\%$. Accordingly, it is found that using a core separately from the embedded active layer can significantly suppress the spread of light to p-type InP, which would otherwise become the main cause of propagation loss. Suppressing the spread of light to p-type InP in this manner can reduce the waveguide loss. Thus, higher output power and narrower linewidth of the semiconductor laser can be achieved.

CITATION LIST

Patent Literature

Patent Literature 1: Japanese Patent Laid-Open No. 2016-171173.

SUMMARY

Technical Problem

Si has a band gap of about 1.1 eV and is likely to exhibit a nonlinear optical effect, such as two-photon absorption, with respect to light in the optical communication wavelength range. Thus, when the optical power density in the core of Si has increased, it can become a cause of an increase in the propagation loss. Therefore, using Si as a core material has limitations in increasing the performance of the semiconductor laser, such as the output power and the linewidth. In the calculation results in FIG. 14B, light confinement in the Si core is $\Gamma_{Si}=77.06\%$. Thus, it is found that light is strongly confined in the Si core.

Therefore, to further increase the output power and reduce the linewidth of the semiconductor laser, it is desired to use as the core material a material that has a band gap wider than that of Si and is unlikely to exhibit a nonlinear optical effect. Examples of such material include SiN and $SiO_2$.

FIG. 14C illustrates the calculation results when SiN is used as the core material. Herein, the refractive index of SiN is 2.00, the thickness of the core is 0.5 μm, and the width of the core is 1 μm. However, as illustrated in FIG. 14C, when SiN is used as the core material, an electric field is distributed around the active layer as the center, and thus, it is impossible to suppress the spread of light to p-type InP. The light confinement coefficients of p-type InP and SiN are $\Gamma_{pInp}=2.34\%$ and $\Gamma_{SiN}=9.01\%$, respectively, and thus, it is far more difficult to suppress the spread of light to p-type InP than when Si is used. This is because the refractive index of SiN is sufficiently lower than the refractive index (which is greater than or equal to 3) of the group III-V layer. Therefore, when a material with a refractive index of about 2, such as SiN, is used as the core, the core is unlikely to exhibit a nonlinear optical effect, but it is difficult to suppress the spread of light to p-InP.

Embodiments of the present invention have been made to solve the foregoing problem, and it is an embodiment of the present invention to reduce waveguide loss of a semiconductor optical device with an embedded optical waveguide structure even when a material that is unlikely to exhibit a nonlinear optical effect is used as a core material.

Means for Solving the Problem

A semiconductor optical device according to embodiments of the present invention includes an optical waveguide formed on a substrate and including a core; an active layer formed above the substrate and extending along the core in a state in which the active layer can be optically coupled to the core; a p-type semiconductor layer and an n-type semiconductor layer formed in contact with the active layer above the substrate; an n-type electrode connected to the n-type semiconductor layer; a p-type electrode connected to the p-type semiconductor layer; and a resonator structure that confines light in the active layer, in which the p-type semiconductor layer and the n-type semiconductor layer are formed sandwiching the active layer as seen in a plan view, and the core has a thickness at which a higher-order mode appears.

In the aforementioned configuration example of the semiconductor optical device, the higher-order mode is an $E_{12}$ mode.

In the aforementioned configuration example of the semiconductor optical device, the core is arranged between the substrate and the active layer.

In the aforementioned configuration example of the semiconductor optical device, the core is arranged above the active layer as seen from a side of the substrate.

In the aforementioned configuration example of the semiconductor optical device, the core is formed of a material with a refractive index of 1.5 to 2.2.

In the aforementioned configuration example of the semiconductor optical device, the core is formed of SiN or SiON. Alternatively, the core is formed of SiN or SiON and contains deuterium.

Effects of Embodiments of the Invention

As described above, according to embodiments of the present invention, a core, which is arranged in a state in which the core can be optically coupled to an active layer, is formed to a thickness at which a higher-order mode appears. Thus, even when a material that is unlikely to exhibit a nonlinear optical effect is used as a material of the core, it is possible to reduce waveguide loss of the semiconductor optical device with the embedded optical waveguide structure.

BRIEF DESCRIPTION OF THE DRAWINGS

FIGS. 14A-14C are illustration views for illustrating an $E_{11}$ mode.

DETAILED DESCRIPTION OF ILLUSTRATIVE EMBODIMENTS

Figure 1A:
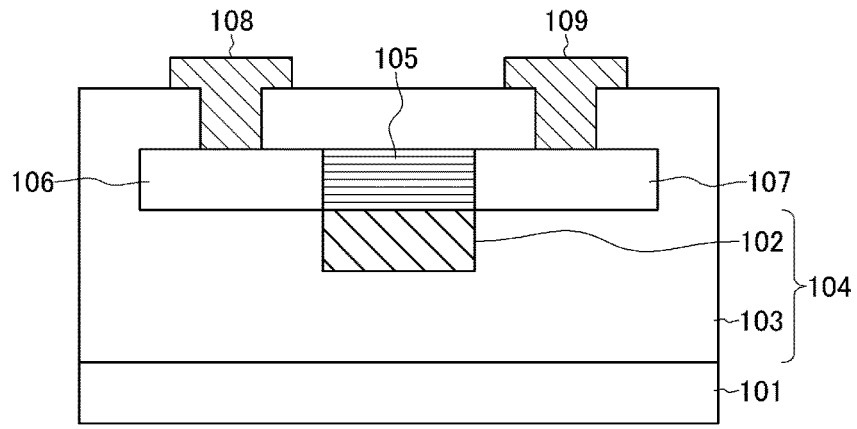
FIG. 1A is a cross-sectional view of the configuration of a semiconductor optical device according to an embodiment of the present invention.
Figure 1B:
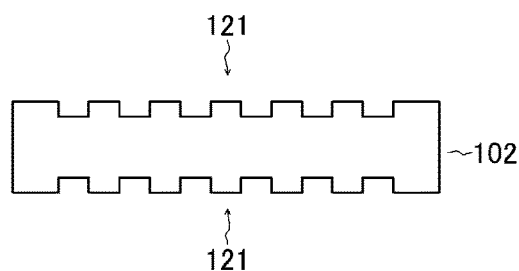
FIG. 1B is a plan view of the configuration of a part of the semiconductor optical device according to an embodiment of the present invention.

Hereinafter, a semiconductor optical device according to an embodiment of the present invention will be described with reference to FIGS. 1A and 1B. The semiconductor optical device first includes an optical waveguide 104 formed on a substrate 101 and including a core 102, and an active layer 105 formed above the substrate 101 along the core 102 (by extending in the waveguide direction of the optical waveguide 104 for a predetermined distance) in a state in which the active layer 105 can be optically coupled to the core 102. The optical waveguide 104 includes the core 102 and a clad 103 formed to have the core 102 embedded therein. In this example, the core 102 and the active layer 105 are arranged in contact with each other. In addition, in this example, the core 102 is arranged between the substrate 101 and the active layer 105.

The substrate 101 is formed of InP that has been made to have a semi-insulating property by being doped with iron, for example. The core 102 is formed of a material with a refractive index of about 1.5 to 2.2, such as SiN, for example. In addition, the core 102 is formed to a thickness at which a higher-order mode appears. It should be noted that the thickness of the core 102 is the height of the core 102 as seen from the side of the substrate 101. The higher-order mode is an $E_{12}$ mode, for example. To allow the $E_{12}$ mode to appear in the core 102, the width and thickness of the core 102 as seen in the cross-sectional view are set to 1.0 μm and 0.15 μm or more, respectively, when the refractive index of the core 102 is 2.00, for example. It should be noted that the core 102 may also be formed using SiON. SiN and SiON are materials that are unlikely to exhibit a nonlinear optical effect.

The clad 103 is formed using InP, for example. The clad 103 may also be formed using GaAs. The active layer 105 is, for example, a quantum well structure obtained by stacking eight layers each including a well layer of InGaAsP with a thickness of 6 nm and a barrier layer with a thickness of 9 nm, and has a thickness of about 250 nm. In such a case, the light-emission wavelength of the active layer 105 is 1.55 μm. It should be noted that the active layer 105 may also be formed using InGaAlAs, for example. Such a structure is an embedded hetero structure in which the active layer 105 is embedded in the clad 103.

In addition, the semiconductor optical device includes a p-type semiconductor layer 106 and an n-type semiconductor layer 107 formed in contact with the active layer 105, above the substrate 101. For example, the p-type semiconductor layer 106 is formed using p-type InP doped with about $1 \times 10^{18}$ cm$^{-3}$ of Zn, and the n-type semiconductor layer 107 is formed using n-type InP doped with about $1 \times 10^{18}$ cm$^{-3}$ of Si. The p-type semiconductor layer 106 and the n-type semiconductor layer 107 are formed sandwiching the active layer 105 therebetween as seen in a plan view. In this configuration, current is injected into the active layer 105 from a direction (i.e., transverse direction) parallel with the plane of the substrate 101.

Each layer of the aforementioned compound semiconductor is formed through crystal growth using well-known metal organic chemical vapor deposition, for example. In addition, to form the core 102, the active layer 105, and diffraction gratings 121 described below, patterning, such as a known lithography technique and wet etching or dry etching, is used.

The semiconductor optical device also includes an n-type electrode 109 connected to the n-type semiconductor layer 107, and a p-type electrode 108 connected to the p-type semiconductor layer 106. In addition, the semiconductor optical device has the diffraction gratings 121 formed in the core 102, as a resonator structure for confining light in the active layer 105, and thus is formed as a distributed feedback laser. The diffraction gratings 121 are formed on the lateral portions of the core 102.

Figure 2:
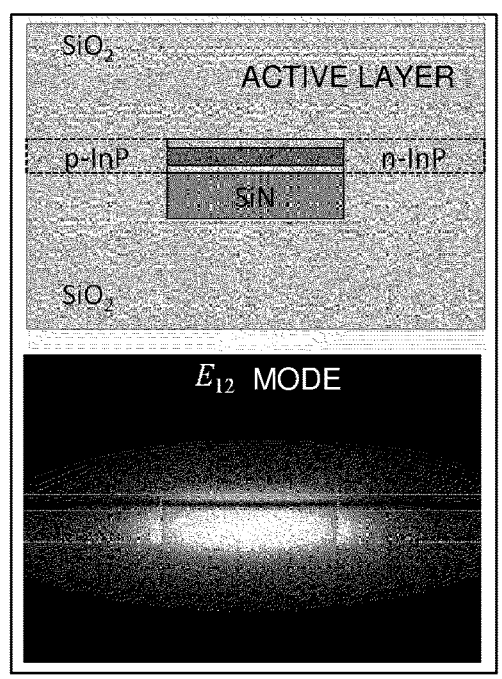
FIG. 2 is an illustration view for illustrating an $E_{12}$ mode.

The $E_{12}$ mode is used to strongly confine light in the core 102, which is formed of a material with a refractive index lower than those of semiconductors, and to suppress overlap of optical modes with the p-type semiconductor layer 106. In this mode, as illustrated in FIG. 2, the number of waves of the transverse electromagnetic field components in the y-axis direction is two, and the optical mode is strongly distributed in the core of SiN (the first wave), and thus, the spread of light to p-type InP (p-InP) is suppressed. In addition, since the light overlaps with the active layer (the second wave), a gain is secured.

To select the aforementioned $E_{12}$ mode as a laser oscillation mode, the periods of the diffraction gratings 121 are determined so that the reflectivity of the $E_{12}$ mode becomes high and the Bragg wavelength of the $E_{12}$ mode overlaps with the gain distribution of the active layer 105.

Figure 3:
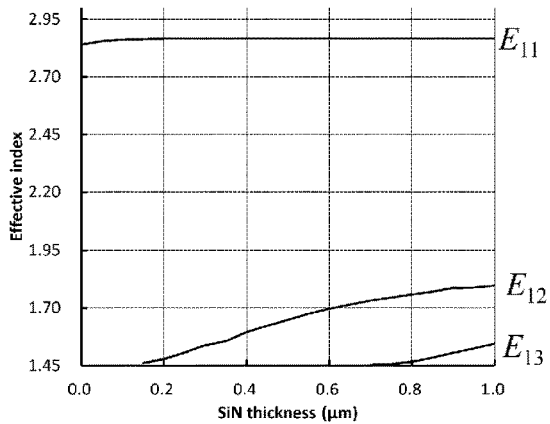
FIG. 3 is a characteristic graph illustrating the calculation results in which the abscissa axis indicates the thickness of a core formed of SiN, and the ordinate axis indicates the effective refractive indices of $E_{11}$, $E_{12}$, and $E_{22}$.

FIG. 3 illustrates the calculation results in which the abscissa axis indicates the thickness of the core 102 formed of SiN, and the ordinate axis indicates the effective refractive indices of $E_{11}$, $E_{12}$, and $E_{22}$. From the results, it is found that the $E_{12}$ mode is generated when the thickness of the core 102 formed of SiN is greater than or equal to 0.15 μm.

Figure 4A:
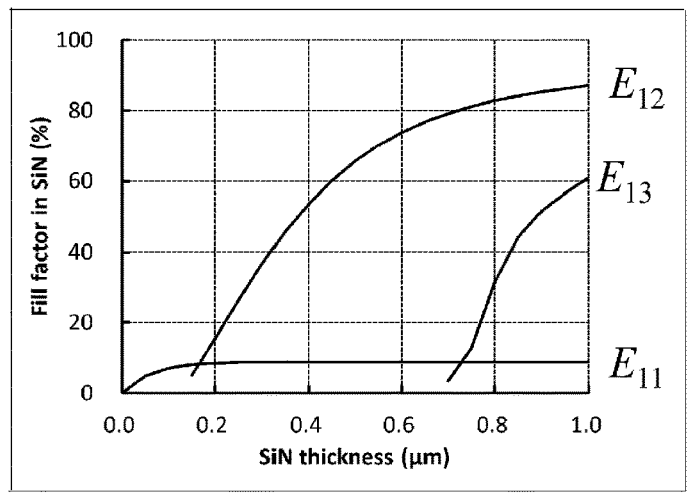
FIG. 4A is a characteristic graph illustrating the results of calculation of light confinement in the core.
Figure 4B:
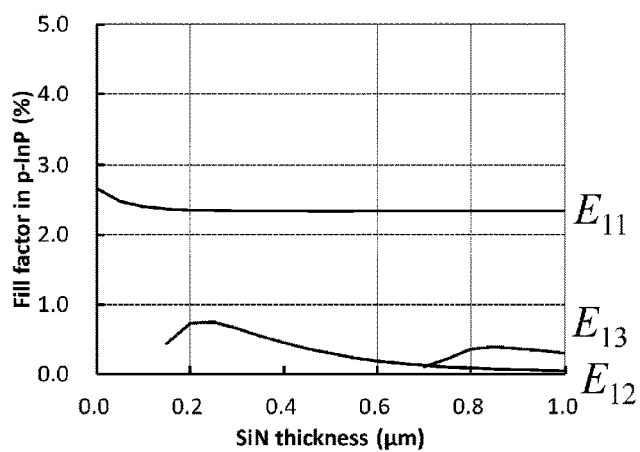
FIG. 4B is a characteristic graph illustrating the results of calculation of light confinement in a p-type semiconductor layer.
Figure 4C:
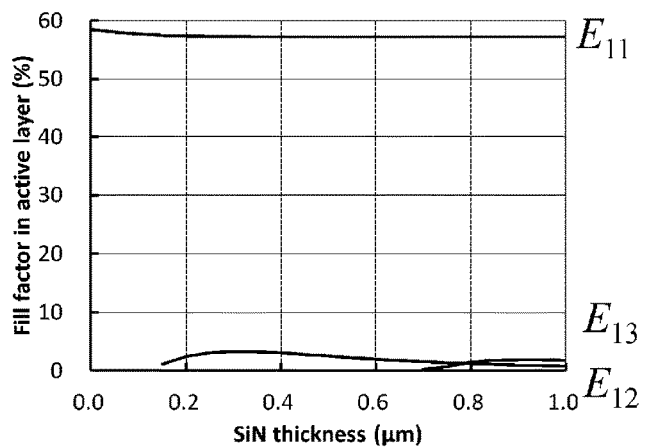
FIG. 4C is a characteristic graph illustrating the results of calculation of light confinement in an active layer.

FIG. 4A illustrates the results of calculation of confinement of light in the core 102. FIG. 4B illustrates the results of calculation of confinement of light in the p-type semiconductor layer 106. FIG. 4C illustrates the results of calculation of confinement of light in the active layer 105. As shown in the calculation results, in the $E_{11}$ mode, almost no portion of light is confined in the core 102, and thus, the mode overlap with the p-type semiconductor layer 106 is large. Meanwhile, in the $E_{12}$ mode, almost all portions of light are confined in the core 102 in contrast to the $E_{11}$ mode, and thus, the mode overlap with the p-type semiconductor layer 106 is found to be suppressed. In addition, in the $E_{12}$ mode, light overlaps with the active layer 105. Thus, a gain for laser oscillation is secured.

Next, the diffraction gratings 121 will be described. First, the period of each diffraction grating 121 is determined so that the Bragg wavelength of the diffraction grating 121 for the $E_{12}$ mode overlaps with the gain wavelength of the active layer 105. For example, suppose a case where the peak gain wavelength of the active layer 105 is 1.55 μm. The effective refractive index of the $E_{12}$ mode is 1.70 when the thickness of the core 102 formed of SiN is 0.6 μm. The Bragg wavelength is given by $\lambda_B = 2n_{eff}\Lambda/m$, where $n_{eff}$ is the effective refractive index, $\Lambda$ is the period of the diffraction grating, and m is the order (a positive integer) of the diffraction grating. Thus, the period of the diffraction grating 121 for setting the Bragg wavelength to 1.55 μm is determined as $\Lambda=0.456$ μm. Herein, the order of the diffraction grating 121 was set to 1.

It should be noted that since the effective refractive index of $E_{11}$ is 2.86, when a diffraction grating with $\Lambda=0.456$ μm is used, the Bragg wavelength for the $E_{11}$ mode is determined as $\lambda_B=2.61$ μm (when m=1), 1.30 μm (when m=2), or 0.869 μm (when m=3). The Bragg wavelength that overlaps with the gain wavelength of the active layer 105 is only the Bragg wavelength for the $E_{12}$ mode when m=1. Thus, the $E_{12}$ mode is selected as a laser oscillation mode.

Figure 5:
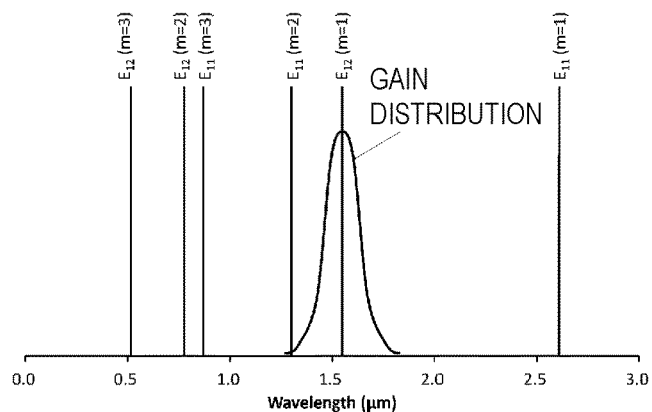
FIG. 5 is an illustration graph for illustrating a state in which the $E_{12}$ mode is selected as a laser oscillation mode.

FIG. 5 illustrates the view described above. As illustrated in FIG. 5, it is necessary to prevent the higher-order mode (m>1) of the diffraction grating for $E_{11}$ from overlapping with the gain distribution. To this end, a combination of the active layer 105 formed of a group III-V compound semiconductor with a thickness of 250 nm and the core 102 formed of SiN with a thickness of 0.6 μm is used, for example.

Next, each diffraction grating 121 is arranged at a position where it has high reflectivity (that is, a high coupling coefficient) for the $E_{12}$ mode, and has low reflectivity (that is, a low coupling coefficient) for the $E_{11}$ mode. For example, the diffraction grating 121 is arranged at a position close to the core 102 where in the $E_{12}$ mode, the greater part of the mode is confined. Specifically, as illustrated in FIG. 1B, the width of the core 102 is periodically changed to obtain the diffraction grating 121. Accordingly, the threshold gain of the $E_{12}$ mode becomes lower than those of the other modes, and the $E_{12}$ mode is selected as a laser oscillation mode.

Although the present embodiment has illustrated an example in which the $E_{12}$ mode is selected, the present invention is not limited thereto. For example, an even higher-order mode, such as an $E_{13}$ mode, may be used. To allow the $E_{13}$ mode to appear in the core, the thickness of the core formed of SiN is set to greater than or equal to 0.7 μm.

Figure 6A:
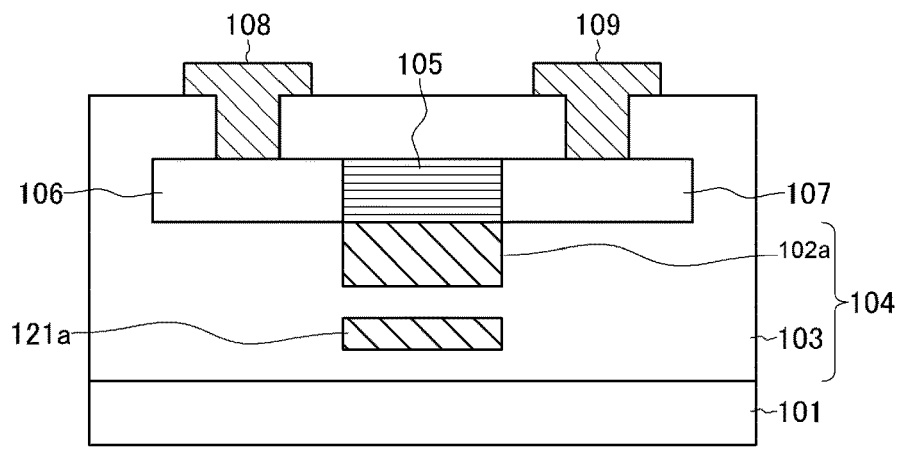
FIG. 6A is a cross-sectional view of the configuration of another semiconductor optical device according to an embodiment of the present invention.
Figure 6B:
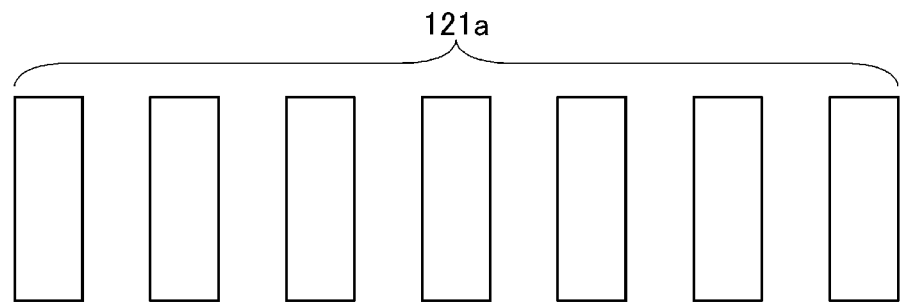
FIG. 6B is a plan view of the configuration of a part of another semiconductor optical device according to an embodiment of the present invention.
Figure 7:
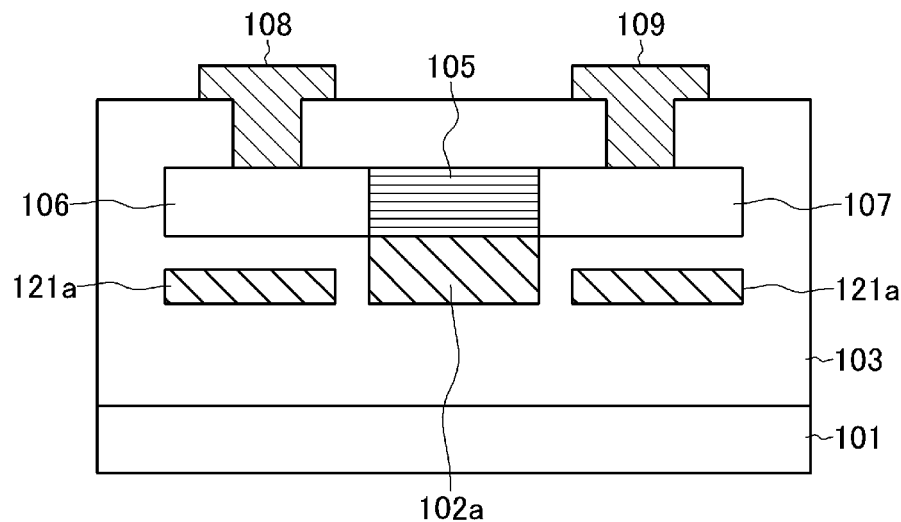
FIG. 7 is a cross-sectional view of the configuration of another semiconductor optical device according to an embodiment of the present invention.

In addition, as illustrated in FIGS. 6A and 6B, a diffraction grating 121a may be provided between a core 102a and the substrate 101. Alternatively, as illustrated in FIG. 7, diffraction gratings 121a may be arranged around the opposite sides of the core 102a. Adjusting the gap between the core 102a and each diffraction grating 121a can adjust the coupling coefficient of the diffraction grating 121a. Examples of the material of the diffraction grating 121a include SiN, Si, and $SiO_x$.

Figure 8:
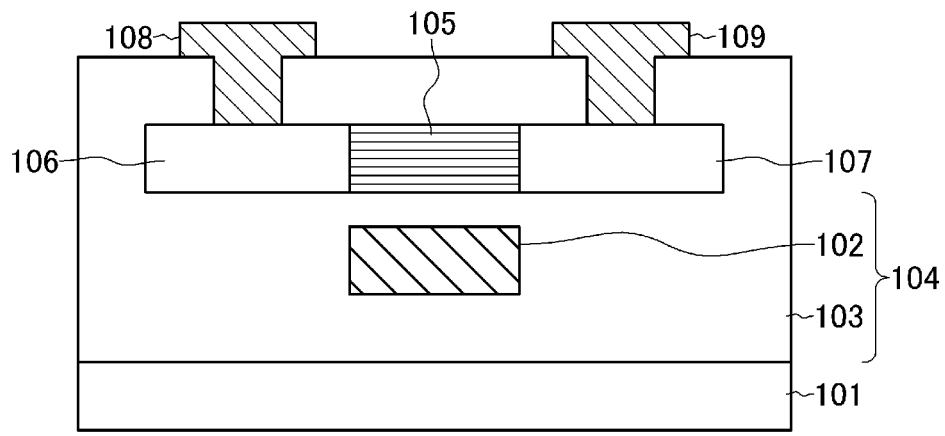
FIG. 8 is a cross-sectional view of the configuration of another semiconductor optical device according to an embodiment of the present invention.

As illustrated in FIG. 8, the core 102 and the active layer 105 may be arranged apart from each other. It is acceptable as long as the core 102 and the active layer 105 are arranged in a state in which they can be optically coupled and the distance between the core 102 and the active layer 105 is 0 to 0.5 μm, for example.

Figure 9:
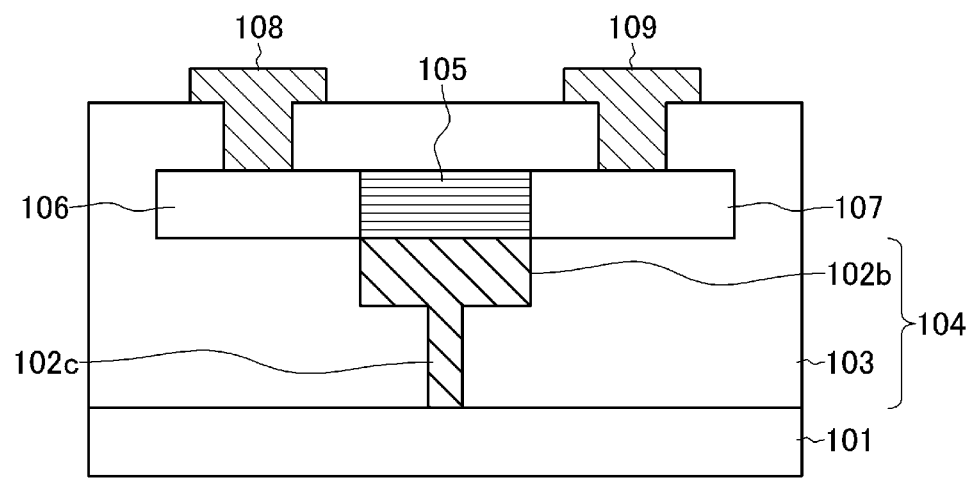
FIG. 9 is a cross-sectional view of the configuration of another semiconductor optical device according to an embodiment of the present invention.

As illustrated in FIG. 9, a configuration may also be provided in which a core 102b arranged in contact with the active layer 105 includes a connection portion 102c that reaches the substrate 101. Such a configuration can provide a path for the flow of heat generated in the active layer 105 during operation, specifically, from the active layer 105→the core 102b→the connection portion 102c→the substrate 101, and thus, an improvement in the temperature characteristics can also be expected.

Figure 10:
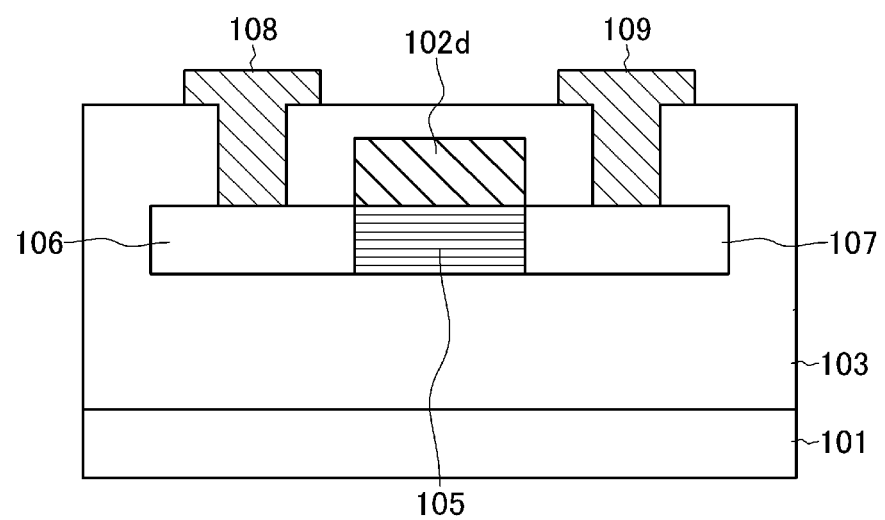
FIG. 10 is a cross-sectional view of the configuration of another semiconductor optical device according to an embodiment of the present invention.
Figure 11:
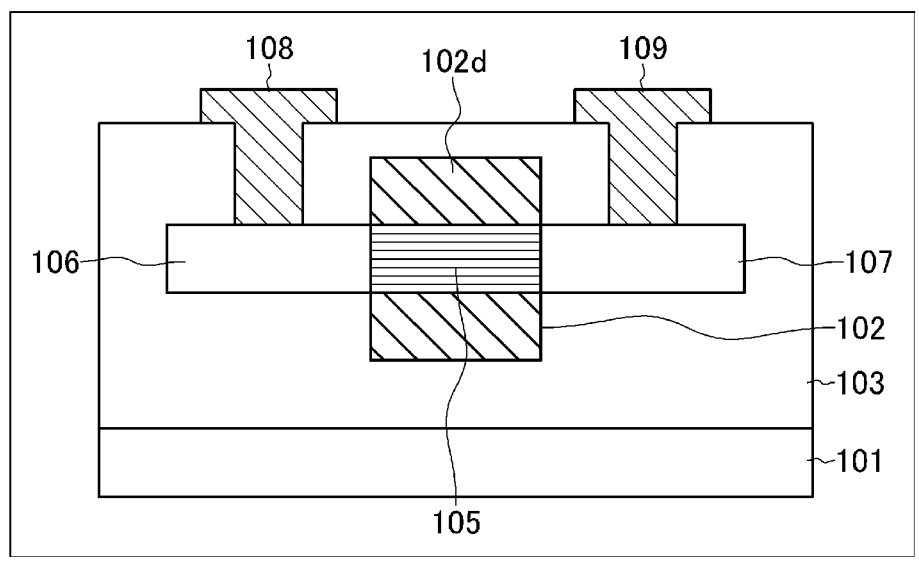
FIG. 11 is a cross-sectional view of the configuration of another semiconductor optical device according to an embodiment of the present invention.
Figure 12:
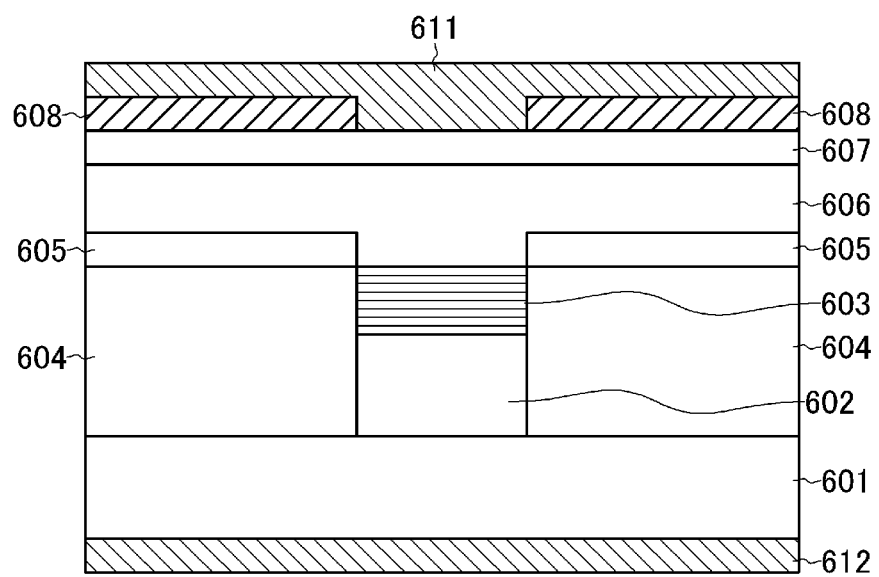
FIG. 12 is a cross-sectional view of the configuration of a semiconductor optical device.
Figure 13A:
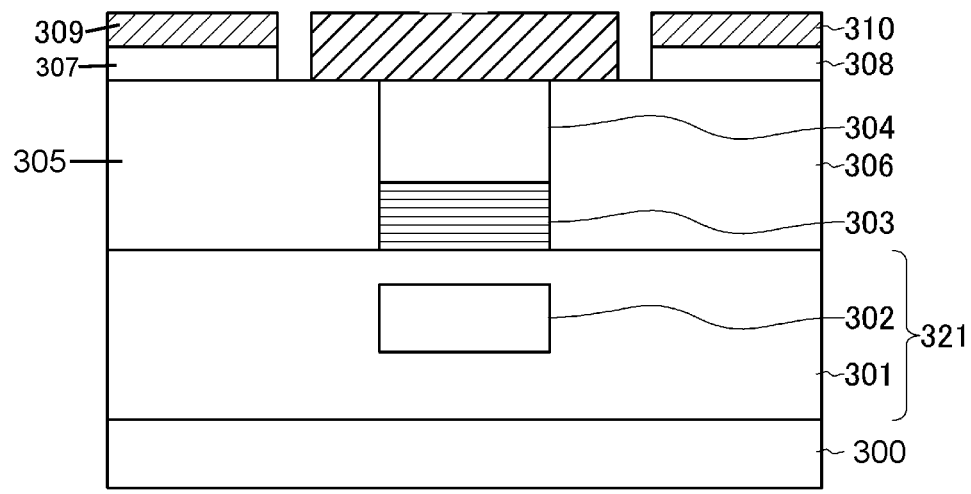
FIG. 13A is a cross-sectional view of the configuration of a semiconductor optical device.
Figure 13B:
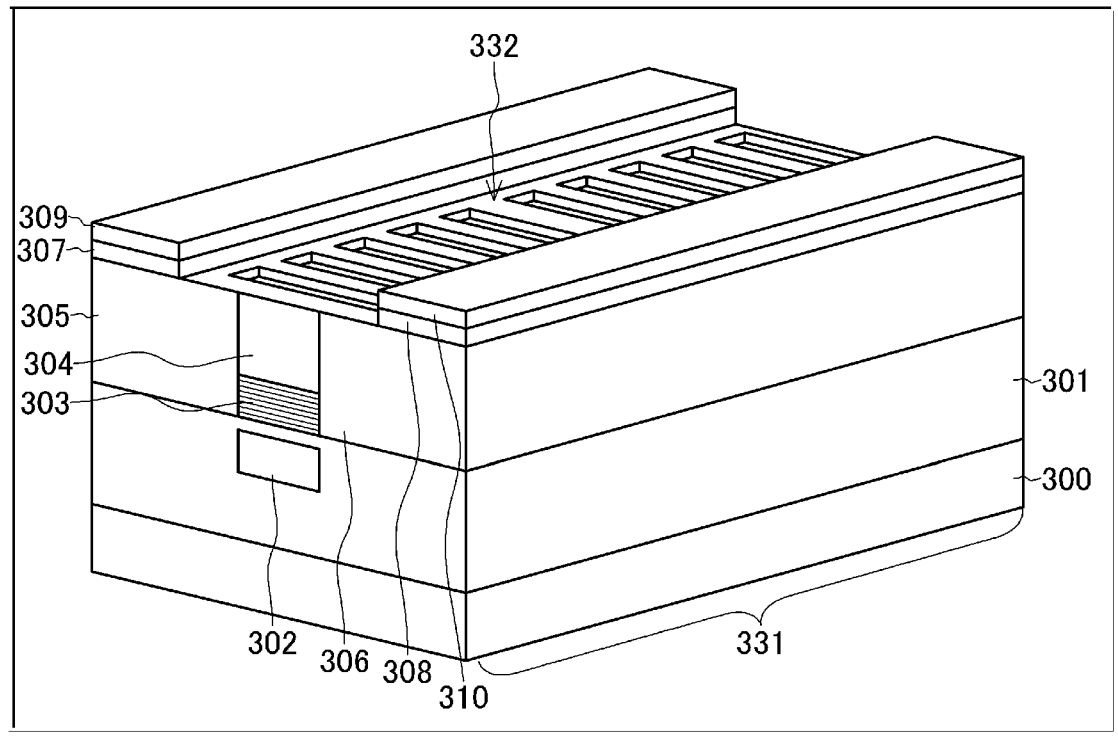
FIG. 13B is a perspective view of the configuration of the semiconductor optical device.

As illustrated in FIG. 10, a configuration may also be provided in which a core 102d is provided above the active layer 105 as seen from the side of the substrate 101. Alternatively, as illustrated in FIG. 11, a configuration may also be provided in which the core 102 is arranged below the active layer 105, and the core 102d is arranged above the active layer 105. When the core 102d and the core 102 are arranged above and below the active layer 105, the $E_{13}$ mode appears in the core 102d and the core 102, and the peak of the electric field intensity appears in the core 102d, the core 102, and the active layer 105. With such a configuration, advantageous effects similar to those of the embodiment described with reference to FIGS. 1A and 1B are expected to be obtained.

By the way, when the core 102d of SiN is formed above the active layer 105, a SiN film for forming the core 102d is formed (deposited) by ECR plasma CVD as described below. When ECR plasma CVD is used, the film formation reaction is allowed to proceed using ions with high electron energy. Thus, the substrate need not be heated and low-temperature film formation is possible. When a SiN film is formed with such a film formation method, there is no possibility that an active element portion, such as the active layer 105, that has been already formed will be damaged.

Herein, to form a SiN film using ECR plasma CVD, SiH$_4$, Si$_2$H$_6$, or the like is used as a source gas for Si. In such a case, an N—H group is formed in the SiN film to be formed. Absorption of light by the N—H group appears at a wavelength of about 1510 nm. Thus, the optical waveguide including the core 102*d* formed of a SiN film containing an N—H group is not suitable as a constituent element of a semiconductor laser used for optical communication.

To solve such a problem, the N—H group in the SiN film has only to be reduced. To this end, a deuterated silane gas not containing H is used as a source gas for Si. According to ECR plasma CVD using a deuterated silane gas, formation of an N—H group in the SiN film can be suppressed. Consequently, the optical waveguide including the core 102*d* formed of such a SiN film can suppress absorption of light with a wavelength of about 1510 nm. It should be noted that a SiN film formed by ECR plasma CVD using a deuterated silane gas contains deuterium. This is also true of a case where the core 102*d* is formed using SiON.

As described above, according to embodiments of the present invention, a core, which is arranged in a state in which the core can be optically coupled to an active layer, is formed to a thickness at which a higher-order mode appears. Thus, even when a material that is unlikely to exhibit a nonlinear optical effect is used as a material of the core, it is possible to reduce waveguide loss of the semiconductor optical device with the embedded optical waveguide structure.

It should be noted that the present invention is not limited to the embodiments described above, and it is apparent that one of ordinary skill in the art can apply various modifications and combinations within the technical idea of the present invention.

REFERENCE SIGNS LIST

101 Substrate
102 Core
103 Clad
104 Optical waveguide
105 Active layer
106 p-type semiconductor layer
107 n-type semiconductor layer
108 p-type electrode
109 n-type electrode
121 Diffraction grating

The invention claimed is:

1. A semiconductor optical device comprising:
   an optical waveguide on a substrate, the optical waveguide including a core having a thickness at which a higher-order mode appears;
   an active layer above the substrate, the active layer extending along the core and configured to be optically coupled to the core, wherein the core and the active layer are in physical contact with each other;
   a p-type semiconductor layer and an n-type semiconductor layer in contact with the active layer above the substrate and sandwiching the active layer in a plan view; and
   a resonator structure configured to confine light in the active layer.

2. The semiconductor optical device according to claim 1, wherein the higher-order mode is an E12 mode.

3. The semiconductor optical device according to claim 1, wherein the core is between the substrate and the active layer.

4. The semiconductor optical device according to claim 1, wherein the core is above the active layer as viewed from a side of the substrate.

5. The semiconductor optical device according to claim 1, wherein the core comprises a material with a refractive index of 1.5 to 2.2.

6. The semiconductor optical device according to claim 5, wherein the core comprises SiN or SiON.

7. The semiconductor optical device according to claim 6, wherein the core comprises deuterium.

8. The semiconductor optical device according to claim 1, further comprising:
   an n-type electrode connected to the n-type semiconductor layer; and
   a p-type electrode connected to the p-type semiconductor layer.

9. The semiconductor optical device according to claim 1, wherein the resonator structure includes a diffraction grating in the core.

10. A semiconductor optical device comprising:
    an optical waveguide on a substrate, the optical waveguide including a core having a thickness at which a higher-order mode appears;
    an active layer above the substrate, the active layer extending along the core and optically coupled to the core, wherein the core and the active layer are in physical contact with each other;
    a p-type semiconductor layer and an n-type semiconductor layer in contact with the active layer above the substrate and sandwiching the active layer in a plan view;
    an n-type electrode connected to the n-type semiconductor layer;
    a p-type electrode connected to the p-type semiconductor layer; and
    a resonator structure configured to confine light in the active layer, the resonator structure including a diffraction grating in the core.

11. The semiconductor optical device according to claim 10, wherein the higher-order mode is an E12 mode.

12. The semiconductor optical device according to claim 10, wherein the core is between the substrate and the active layer.

13. The semiconductor optical device according to claim 12, further comprising a second core above the active layer as viewed from a side of the substrate.

14. The semiconductor optical device according to claim 10, wherein the core is above the active layer as viewed from a side of the substrate.

15. The semiconductor optical device according to claim 10, wherein the core comprises a material with a refractive index of 1.5 to 2.2.

16. The semiconductor optical device according to claim 10, wherein the core comprises SiN or SiON.

17. The semiconductor optical device according to claim 16, wherein the core comprises deuterium.

18. A method of forming a semiconductor optical device, the method comprising:
    forming an optical waveguide on a substrate, the optical waveguide including a core having a thickness at which a higher-order mode appears, the higher-order mode being an E12 mode or higher;
    forming an active layer above the substrate, the active layer extending along the core and being optically coupled to the core, wherein the core and the active layer are in physical contact with each other;

forming a p-type semiconductor layer and an n-type semiconductor layer in contact with the active layer above the substrate and sandwiching the active layer in a plan view; and forming a resonator structure to confine light in the active layer.

19. The method according to claim 18, wherein the core comprises SiN or SiON.

20. The method according to claim 18, further comprising:

forming an n-type electrode connected to the n-type semiconductor layer; and forming a p-type electrode connected to the p-type semiconductor layer.

* * * * *